(12) United States Patent
Bedell et al.

(10) Patent No.: US 9,601,624 B2
(45) Date of Patent: Mar. 21, 2017

(54) SOI BASED FINFET WITH STRAINED SOURCE-DRAIN REGIONS

(71) Applicant: GLOBALFOUNDRIES INC., Grand Cayman (KY)

(72) Inventors: Stephen W. Bedell, Wappingers Falls, NY (US); Joel P. de Souza, Putnam Valley, NY (US); Keith E. Fogel, Hopewell Junction, NY (US); Alexander Reznicek, Troy, NY (US); Devendra K. Sadana, Pleasantville, NY (US); Dominic J. Schepis, Wappingers Falls, NY (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 0 days.

(21) Appl. No.: 14/585,742

(22) Filed: Dec. 30, 2014

(65) Prior Publication Data

US 2016/0190302 A1    Jun. 30, 2016

(51) Int. Cl.
| | | |
|---|---|---|
| H01L 29/78 | (2006.01) | |
| H01L 29/66 | (2006.01) | |
| H01L 29/161 | (2006.01) | |
| H01L 29/06 | (2006.01) | |
| H01L 21/84 | (2006.01) | |

(Continued)

(52) U.S. Cl.
CPC ...... *H01L 29/785* (2013.01); *H01L 21/02164* (2013.01); *H01L 21/02238* (2013.01); *H01L 21/845* (2013.01); *H01L 29/0649* (2013.01); *H01L 29/161* (2013.01);

(Continued)

(58) Field of Classification Search
CPC ............ H01L 29/785; H01L 29/66795; H01L 29/7848
See application file for complete search history.

(56) References Cited

U.S. PATENT DOCUMENTS

| | | |
|---|---|---|
| 6,774,435 B1 | 8/2004 | Matsumoto et al. |
| 6,946,200 B2 | 9/2005 | Cabuz et al. |

(Continued)

FOREIGN PATENT DOCUMENTS

| | | |
|---|---|---|
| CN | 1610127 A | 4/2005 |
| JP | 55059736 U | 4/1980 |

(Continued)

*Primary Examiner* — John P Dulka
*Assistant Examiner* — Christina Sylvia
(74) *Attorney, Agent, or Firm* — Yuanmin Cai; Hoffman Warnick LLC

(57) ABSTRACT

A method of fabricating a semiconductor device where: (i) the fins are formed over a porous semiconductor material layer (for example, a silicon layer); and (ii) the porous semiconductor layer is then oxidized to form an insulator layer (for example, a $SiO_2$ buried oxide layer). The pores in the porous semiconductor layer facilitate reliable oxidation of the insulator layer by allowing penetration of gaseous oxygen ($O_2$) throughout the layer as it is oxidized to form the insulator layer. In some of these embodiments, a thin non-porous semiconductor layer is located over the porous semiconductor layer (prior to its oxidation) to allow strained epitaxial growth of material to be used in making source regions and drain regions of the finished semiconductor device (for example, a FINFET).

19 Claims, 3 Drawing Sheets

(51) Int. Cl.
*H01L 21/02* (2006.01)
*H01L 29/167* (2006.01)
*H01L 21/762* (2006.01)

(52) U.S. Cl.
CPC ...... *H01L 29/167* (2013.01); *H01L 29/66795* (2013.01); *H01L 29/7848* (2013.01); *H01L 21/7624* (2013.01)

(56) References Cited

U.S. PATENT DOCUMENTS

| | | |
|---|---|---|
| 6,969,425 B2 | 11/2005 | Cabuz et al. |
| 7,365,399 B2 | 4/2008 | de Souza et al. |
| 7,563,720 B2 | 7/2009 | Detry |
| 7,842,940 B2 | 11/2010 | de Souza et al. |
| 8,642,405 B2 | 2/2014 | Fukunaga |
| 2007/0026629 A1* | 2/2007 | Chen ................ H01L 21/82341 438/424 |
| 2007/0069300 A1* | 3/2007 | Cheng ............... H01L 21/02203 257/368 |
| 2007/0158700 A1* | 7/2007 | Koh .................. H01L 29/66795 257/288 |
| 2011/0053361 A1* | 3/2011 | Muralidhar ......... H01L 21/3086 438/585 |

FOREIGN PATENT DOCUMENTS

| | | |
|---|---|---|
| JP | 55059736 A | 5/1980 |
| KR | 100244835 B1 | 2/2000 |
| KR | 1020010085677 A | 9/2001 |

\* cited by examiner

US 9,601,624 B2

SOI BASED FINFET WITH STRAINED SOURCE-DRAIN REGIONS

BACKGROUND OF THE INVENTION

The present invention relates generally to the field of FINFETs (fin-including field-effect transistors), and more particularly to fabrication of FINFETs that are located over an oxide layer.

FINFET (or "FINFET") means any fin-based, multigate transistor architecture regardless of number of gates. Typically, a FINFET includes a nonplanar, multiple-gate transistor built on an SOI (silicon-on-insulator) substrate, where a conducting channel is wrapped by a thin silicon "fin." The wrap-around gate structure provides a better electrical control over the channel and thus helps in reducing the leakage current and overcoming other short-channel effects. The insulator layer of the substrate is typically a buried oxide layer (or BOX), made of a material such as silicon dioxide ($SiO_2$).

In conventional methods for fabricating FINFETs, growing an epitaxial source-drain region from the silicon substrate allows good quality, highly-strained regions to form surrounding the channel region of the FINFET. For bulk FINFET devices, this allows for higher performance due to increased mobility from the strain. Unfortunately, bulk FINFETs suffer from fin width variability due to the STI (shallow trench isolation) recess which can add to device variability. SOI (silicon on insulator) FINFETs, by comparison, have the advantage that the device width is defined by the silicon above the buried oxide (BOX), and not by the STI recess, leading to less device variability.

SUMMARY

According to an aspect of the present invention, there is a method of forming structures to be used in a semiconductor device. The method includes the following steps (not necessarily in the following order): (i) providing a pre-fin laminate structure including a set of base layer(s), a porous semiconductor layer and a fin-making layer, with the porous semiconductor layer being located on a top surface of the base layer(s), and with the fin-making layer being located on a top surface of the porous semiconductor layer; (ii) refining the pre-fin laminate structure into a fin-bearing laminate structure by selectively removing material from the fin-making layer to form a set of fin structures from the material of the fin-making layer; (iii) refining the fin-bearing laminate structure into a gate-bearing laminate structure by forming a set of gate structures with each gate structure of the set of gate structures extending over and across at least some of the fin structures; (iv) refining the gate-bearing laminate structure into a component-bearing laminate structure by forming a component-making layer of semiconductor material in at least some areas bounded by a pair of fin structures and a pair of gate structures; and (v) refining the component-bearing laminate structure into a buried-insulator laminate structure by introducing reactive gas into pores of the porous semiconductor layer under conditions where the reactive gas reacts with the porous semiconductor layer to chemically change semiconductor material of the porous semiconductor layer into electrically insulative material.

According to a further aspect of the present invention, there is a method of forming structures to be used in a semiconductor device. The method includes the following steps (not necessarily in the following order): (i) providing a first laminate structure including a set of base layer(s) including at least a top base layer, where the top base layer is made of silicon; (ii) refining the first laminate structure into a second laminate structure by epitaxially growing a highly-doped silicon layer on a top surface of the top base layer; (iii) refining the second laminate structure into a third laminate structure by epitaxially growing a fin-making layer on a top surface of the highly-doped silicon layer, with the fin-making layer being made of semiconductor material; (iv) refining the third laminate structure into a fourth laminate structure by performing a porousification process to form pores in the highly-doped silicon layer in order to change the highly-doped silicon layer into a porous silicon layer; (v) refining the fourth laminate structure into a fifth laminate structure by selectively removing material from the fin-making layer to form a set of fin structures from the material of the fin-making layer; (vi) refining the fifth laminate structure into a sixth laminate structure by forming a set of gate structures with each gate structure of the set of gate structures extending over and across at least some of the fin structures; (vii) refining the sixth laminate structure into a seventh laminate structure by growing by strained epitaxy a component-making layer of semiconductor material in at least some areas bounded by a pair of fin structures and a pair of gate structures; and (viii) refining the seventh laminate structure into an eighth laminate structure by introducing oxygen gas into pores of the porous silicon layer at an elevated temperature to oxidize the silicon of the porous silicon layer and thereby changing the porous silicon layer into a buried oxide layer.

According to a further aspect of the present invention, a laminate structure is for use in making a semiconductor device. The laminate structure includes: (i) a porous semiconductor layer made of semiconductor material with pores formed therein; (ii) a component-base layer located on a top surface of the porous silicon layer, with the component-base layer being non-porous to the extent that a top surface of the component-base layer is suitable for being used as a base for strained epitaxial growth of semiconductor material and with the component base layer being made of lightly-doped silicon material; and (iii) a set of fin structures extending upwards from the component base layer, with the set of fin structures being made of the same material as, and being unitary with, the component base layer.

DETAILED DESCRIPTION

Figure 1A:
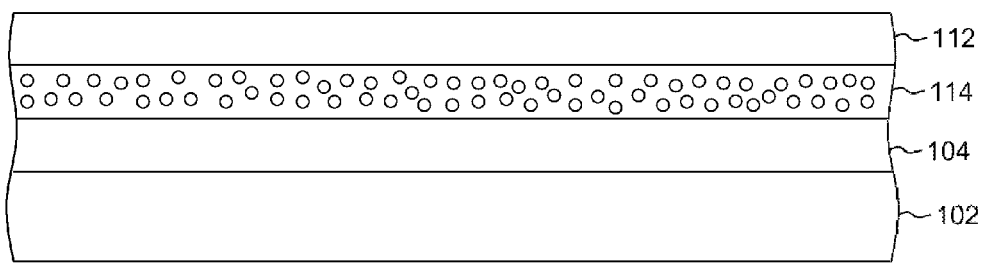
FIG. 1A is a cross-sectional view (cross-hatching omitted for clarity of illustration) of a first embodiment of a semiconductor device as it is being fabricated.

Some embodiments of the present invention are directed to a method of fabricating a semiconductor device where: (i)

the fins are formed over a porous semiconductor material layer (for example, a silicon layer); and (ii) the porous semiconductor layer is then oxidized to form an insulator layer (for example, a SiO2 BOX layer). The pores in the porous semiconductor layer facilitate reliable oxidation of the insulator layer by allowing penetration of oxygen (O$_2$) throughout the layer as it is oxidized to form the insulator layer. In some of these embodiments, a thin non-porous semiconductor layer (herein called a component-base layer) is located over the porous semiconductor layer to allow formation of semiconductor components, such as source regions and drain regions. In some embodiments, a single unitary layer of semiconductor material (herein called a fin-making layer, made of, for example, silicon) is used to form both the fins and the component-making layer by selective removal of material from the fin-making layer.

Some embodiments of the present invention are directed to an SOI FINFET design where a recess of the source drain regions allows for a silicon template from which to grow the source-drain regions. Some embodiments of the present invention provide a method and structure by which to build a FINFET with a source-drain region that is strained like a bulk device, and which retains the features of a fully strained SOI FINFET in the final structure.

Some embodiments of the present invention form a FIN-FET (fin field effect transistor) device on a porous silicon structure, making the interlayer porous (such as SOI (silicon on insulator)), grow silicon on top and then perform conventional FINFET processing. After growth of the strained source-drain region, the porous silicon is converted to an oxide forming the BOX (buried oxide) of the SOI FINFET.

An embodiment of a fabrication process according the present invention will now be described with reference to FIGS. 1A to 1E (respectively showing intermediate fabrication stages 100a to 100e of a FINFET semiconductor device as it is being fabricated). More specifically: (i) fabrication stage 100a (also called pre-fin laminate structure) of FIG. 1A includes: first base layer 102, second base layer 104, porous semiconductor layer 114 and fin-making layer 112; (ii) fabrication stage 100b (also called fin-bearing laminate structure) of FIG. 1B includes: first base layer 102, second base layer 104, porous semiconductor layer 114, fin structures 116, and component-base layer 118; (iii) fabrication stage 100c (also called gate-bearing laminate structure) of FIG. 1C includes: first base layer 102, second base layer 104, porous semiconductor layer 114, fin structures 116, component-base layer 118 and gate structures 120; (iv) fabrication stage 100d (also called a component-bearing laminate structure) of FIG. 1D includes: first base layer 102, second base layer 104, porous semiconductor layer 114, fin structures 116, component-base layer 118, gate structures 120 and component-making layer 122; and (v) fabrication stage 100e (also called buried-insulator laminated structure) of FIG. 1E includes: first base layer 102, second base layer 104, BOX layer 124, fin structures 116, gate structures 120 and component-making layer 122.

As shown in FIG. 1A, laminate structure of fabrication stage 100a is provided at the start of the fabrication method that will now be described over the course of the following paragraphs.

In this embodiment, first base layer 102 is made of 100-silicon (100 refers to the silicon's orientation as will be understood by those of skill in the art). Alternatively, other semiconductor materials and/or orientations could be used. In this embodiment, first base layer 102 is 873 micrometers in thickness. Alternatively, other thicknesses can be used. In this embodiment, layer 102 is high p-doped, but other kinds of doping (or no doping) are also possible.

In this embodiment, second base layer 104 is made of silicon with a P++ boron doping. More specifically, in this embodiment, the boron dopant concentration is 2E18 dopant atoms per centimeter squared (atom/cm$^2$). In the context of this embodiment, this dopant concentration is referred to as low doping. Alternatively, other kinds of doping (or no doping) could be used. In this embodiment, the thickness of second base layer 104 is 2.0 micrometers. Alternatively, other thicknesses could be used. As a further alternative, the second base layer could be omitted. As another alternative, more than two base layers could be present. While the base layer(s) do not necessarily need to be made from semiconductor material, by making the base layer(s) from semiconductor material(s) (such as Si or SiGe (silicon germanium)), it makes it possible to grow porous semiconductor layer 114 by epitaxial growth on top of the top surface of the uppermost base layer (in this embodiment, base layer 104).

In this embodiment, porous semiconductor layer 114 is: (i) first epitaxially grown on the top surface of base layer 104; and (ii) then made porous by a process herein called "porousification." In this embodiment, at the time layer 114 is epitaxially grown on the top surface of second base layer 104, it is grown and/or treated to be made of silicon with a boron doping. More specifically, in this embodiment, the boron dopant concentration is 2E20 atom/cm$^2$, which is referred to as "high doping" in the context of this embodiment. The high doping will help with porousification, both with forming the pores and with making them relatively large. In this embodiment, the thickness of porous semiconductor layer 114 is 1.5 micrometers. Alternatively, other thicknesses could be used. Because this layer will later become a BOX layer, the thickness should be made suitable for a BOX layer. The "porousification" process used in this embodiment will be further discussed two paragraphs below, after a discussion of fin-making layer 112 as it exists in fabrication stage 100a shown in FIG. 1A.

In this embodiment, fin-making layer 112 is made of silicon that is P-doped with boron at a concentration of 5E18 atoms/cm$^2$. This doping concentration is low compared to the high-doped doping concentration of porous semiconductor material layer 114. It may be possible to use other kinds of doping and/or other types of semiconductor material (for example, SiGe), but it should be kept in mind that this layer 112 will be used to make fins and also as a base layer upon which to grow device components such as source regions and drain regions. In this embodiment, fin-making layer 112 is epitaxially grown on porous semiconductor layer before porous semiconductor layer 114 has undergone porousification (as will be discussed in the next paragraph). This pre-porousification growth of fin-making layer 112 allows reliable, uniform epitaxial growth of fin-making layer 112. In this embodiment, fin-making layer 112 is between 20 and 100 nm (nanometers) in thickness, depending upon the height of the fins that are desired. In this embodiment, the thickness of fin-making layer 112 is equal to the height of the desired fin structures, plus the thickness of a component-base layer (as will be discussed in more detail, below).

In this embodiment, the porousification process is a conventional porousification process where an HF (hydrogen fluoride) bath reacts with the high doped layer 114 to form the pores in porous semiconductor layer 114. Other types of porousification (now known or to be developed in the future) may be used. The porousification may also result in some relatively small pores in second base layer 104. In this embodiment, the porousification process is followed up with a conventional hydrogen (H$_2$) anneal process that: (i) removes the light boron doping in fin-making layer 112; (ii) closes small pores in fin-making layer 112 and/or the second base layer; and (iii) does not affect the relatively large pores formed in porous semiconductor layer 114.

Figure 1B:
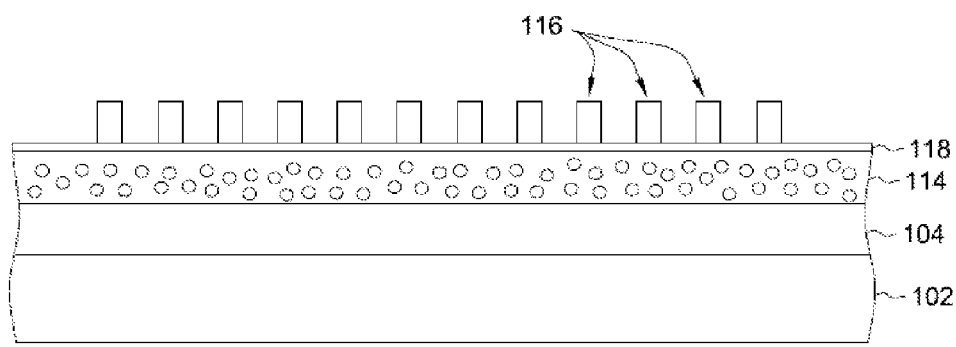
FIG. 1B is another cross-sectional view (cross-hatching omitted for clarity of illustration) of the first embodiment of a semi-conductor device as it is being fabricated.

Fabrication stage 100a of FIG. 1A is refined into fabrication stage 100b of FIG. 1B by selectively removing material from fin-making layer 112 in order to form fin structures 116. While material is removed from between the fins, and at the longitudinal ends of the fins, in this embodiment, the material is not removed all the way down to porous semiconductor layer 114. Instead, even in areas where material is removed from fin-making layer 114, the lowermost portion of the fin-making layer is left intact, and in place, as component-base layer 118. Fin structures 116 and component-base layer 118 are not porous because they are formed by material removal from non-porous fin-making layer 114. More specifically, in this embodiment: (i) the top surface of the fin-making layer is masked over the locations where fin structures 166 will be formed; (ii) the fin-making layer is etched by conventional silicon etching processes to remove material in the unmasked portions so that only a relatively thin (1 to 2 nm, in this embodiment) component-base layer remains over the porous semiconductor layer in the areas between the fin structures; and (iii) the mask is removed, by conventional process(es), from the top surfaces of the newly-formed fin structures 116. As with conventional FINFET devices, the width of the fin structures may be in the range of 6 to 10 nm, and the height of the fin structures is typically greater than 10 nm.

Figure 1C:
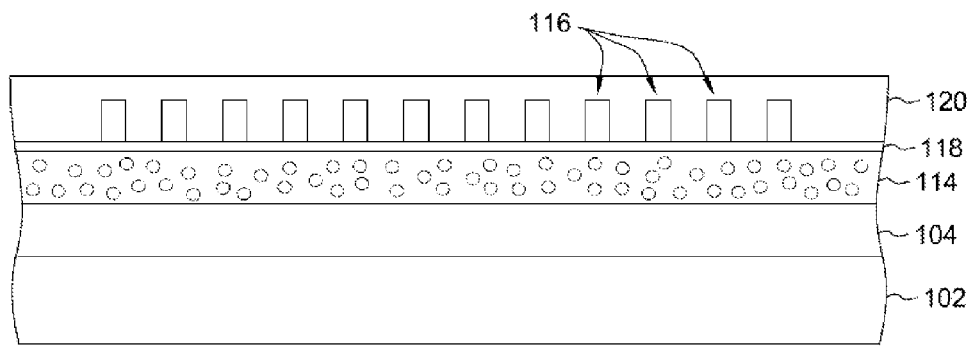
FIG. 1C is another cross-sectional view (cross-hatching omitted for clarity of illustration) of the first embodiment of a semi-conductor device as it is being fabricated.
Figure 2:
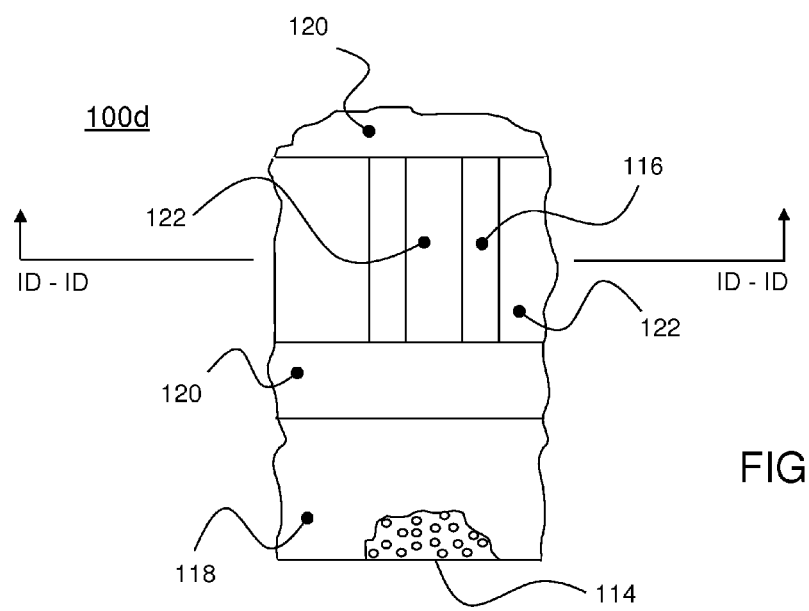
FIG. 2 is a plan view of a portion of the semiconductor device when it is in the FIG. 1D stage of fabrication.

Fabrication stage 100b of FIG. 1B is refined into fabrication stage 100c of FIG. 1C by forming gate structures 120 at spaced apart intervals over component-base layer 118 and fin structures 116. As shown in FIG. 1C, the gate structures: (i) run transverse to the fin structures and are longitudinally spaced apart along the longitudinal length of the fin structures (see also gate structures 120 as shown in FIG. 2); and (ii) have a substantially planar top surface. With respect to item (ii) in the forgoing sentence, this means that the gate structures are taller in height than the fins, and are no taller in areas overlying a fin structure than in areas overlying component-base layer 118. The process(es) for forming the FINFET gate structures is well understood in the art, and, therefore, does not need to be discussed in detail here.

Figure 1D:
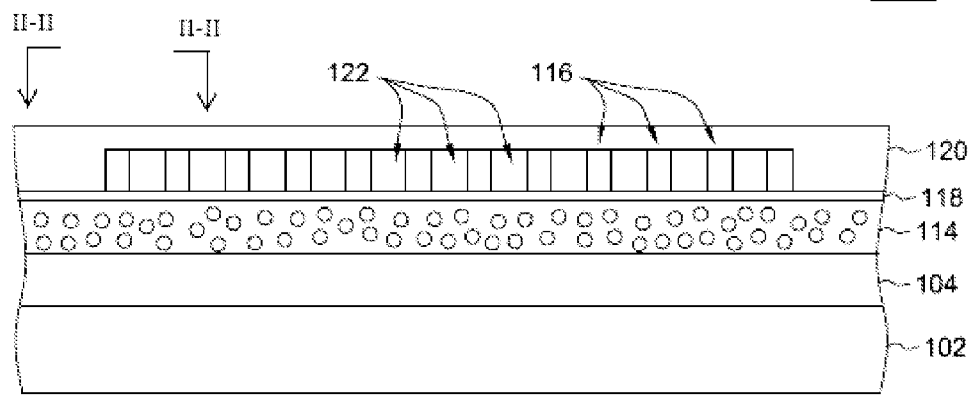
FIG. 1D is another cross-sectional view (cross-hatching omitted for clarity of illustration) of the first embodiment of a semi-conductor device as it is being fabricated.

Fabrication stage 100c of FIG. 1C is refined into fabrication stage 100d of FIG. 1D by forming component-making layer 122 on top of component-base layer 118 between fin structures 116 (in the areas where there is no gate structure present). More specifically, in this embodiment, component-making layer 122 is epitaxially grown upwards from the top surface of component-base layer 118 and is made of Si—Ge. Alternatively, the component-making layer may be made of other semiconductor materials that can be epitaxially grown, and which are suitable for making "strained" source and drain semiconductor components (also called source and drain regions). In this embodiment, component-making layer 122 is grown to be equal in height to gate structures 120, as shown in FIG. 1D. As shown in FIG. 2, component-making layer 122 is split into segments bounded by fin structures 116 (at their lateral sides) and by gate structures 120 (at their ends). As also shown in FIGS. 1D and 2, porous semiconductor layer 114 is still porous at fabrication stage 100d, at the time component-making layer 122 is epitaxially grown. To explain, component-base layer 118 is not porous, and this allows epitaxial growth of component-making layer 122 despite the pores present in porous semiconductor layer 114.

Figure 1E:
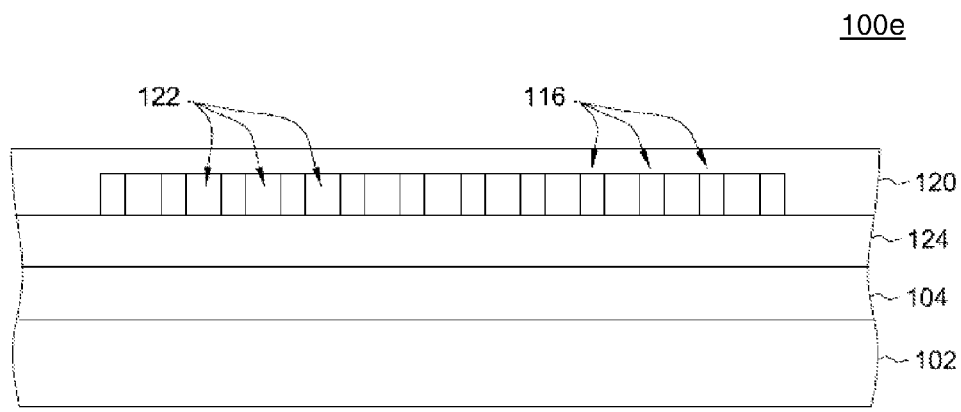
FIG. 1E is another cross-sectional view (cross-hatching omitted for clarity of illustration) of the first embodiment of a semi-conductor device as it is being fabricated.

Fabrication stage 100d of FIG. 1D is refined into fabrication stage 100e of FIG. 1E by oxidizing porous semiconductor layer 114 to chemically change it into BOX layer 124. In this embodiment, the oxidation is performed in a furnace (600 to 700 degrees Celsius) containing an ambient atmosphere of 21% O$_2$ gas and 79% non-reacting gas. In this embodiment, the gas flows through the pores of porous semiconductor layer 114, and the O$_2$ gas chemically combines with the silicon of porous semiconductor layer 114 to form electrically insulative SiO$_2$ (a suitable material for a BOX layer), which causes volume expansion and closes the pores. Alternatively, the conversion of semiconductor material of the porous semiconductor layer into an electrically insulative layer may involve other semiconductor materials and/or other gaseous reacting agents (herein called reactive gas). In this embodiment, component-base layer 118 is also oxidized into SiO2 and, therefore, becomes part of BOX layer 124. Because, in this embodiment, the component-base layer is converted into SiO2 by the oxidation process, component-making layer 122 is epitaxially grown prior to the oxidizing operation.

As will be understood by those of skill in the art, fabrication stage 100e of FIG. 1E may be further refined to: (i) form and/or refine the strained source and drain regions (that is semiconductor components in various portions of component-making layer 122; (ii) further refine the gates and/or (iii) otherwise make the buried-insulator laminate structure into a fully functioning FINFET device.

Some embodiments of the present invention may include one, or more, of the following features, characteristics and/or advantages: (i) forming a FINFET device on a porous silicon structure layer; (ii) making the interlayer porous; (iii) growing a silicon layer on top; (iv) applying conventional FINFET processing (including growth of the strained source-drain region); and/or (v) converting the porous silicon layer to an oxide forming the box of the SOI FINFET.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

What is claimed:

1. A method of forming structures to be used in a semiconductor device, the method, comprising:
   providing a pre-fin laminate structure including a set of base layer(s), a porous semiconductor layer and a fin-making layer, with the porous semiconductor layer being located on a top surface of the base layer(s), and with the fin-making layer being located on a top surface of the porous semiconductor layer;
   refining the pre-fin laminate structure into a fin-bearing laminate structure by selectively removing material from the fin-making layer to form a set of fin structures, and a component-base layer over the porous semiconductor material layer in areas where fin structures are not present, from the material of the fin-making layer;
   refining the fin-bearing laminate structure into a gate-bearing laminate structure by forming a set of gate structures with each gate structure of the set of gate structures extending over and across at least some of the fin structures;
   refining the gate-bearing laminate structure into a component-bearing laminate structure by forming a component-making layer of semiconductor material in at least some areas bounded by a pair of fin structures and a pair of gate structures, wherein the component-making layer is composed of strained semiconductor material epitaxially grown on segmented top surfaces of the component-base layer in segments bounded by pairs of fin structures and pairs of gate structures;
   selectively converting portions of the component-making layer into strained source regions and strained drain regions; and
   refining the component-bearing laminate structure into a buried-insulator laminate structure by introducing reactive gas into pores of the porous semiconductor layer under conditions where the reactive gas reacts with the porous semiconductor layer to chemically change semiconductor material of the porous semiconductor layer into electrically insulative material.

2. The method of claim 1 wherein:
   the fin-making layer is made of semiconductor material that contains silicon atoms.

3. The method of claim 1 wherein:
   the fin-making layer of the pre-fin laminate structure, the fin structures of the fin-bearing laminate structure and the component-base layer of the fin-bearing laminate structure are made of silicon low doped with boron.

4. The method of claim 3 wherein:
   the component-making layer is made of strained silicon germanium.

5. The method of claim 1 further comprising: selectively converting portions of the component-making layer into strained source regions and strained drain regions.

6. The method of claim 1 wherein:
   the reactive gas includes oxygen ($O_2$); and
   the refinement of the component-bearing laminate structure into the buried-insulator laminate structure oxidizes the porous semiconductor layer to chemically change the porous semiconductor into an electrically insulative oxide layer.

7. The method of claim 6 wherein:
   the porous semiconductor layer of the pre-fin, fin-bearing, gate-bearing and component-bearing laminate structures is made of porous silicon; and
   the refinement of the component-bearing laminate structure into the buried-insulator laminate structure oxidizes the porous silicon of the porous silicon layer to chemically change the porous silicon into electrically insulative silicon dioxide ($SiO_2$).

8. The method of claim 7 wherein:
   in the refinement of the pre-fin structure into the fin-bearing laminate structure, the selective removal of material from the fin-making layer leaves a component-base layer over the porous semiconductor material layer in areas where fin structures are not present;
   the component-base layer is made of silicon; and
   the component-base layer is sufficiently thin so that the refinement of the component-bearing laminate structure into the buried-insulator laminate structure further oxidizes the component-base layer to chemically change the component-base layer into electrically insulative silicon dioxide ($SiO_2$).

9. The method of claim 1 wherein:
   the refinement of the component-bearing laminate structure into the buried-insulator laminate structure is performed in a furnace at a high temperature.

10. The method of claim 1 wherein:
    the chemical change of the refinement of the component-bearing laminate structure into the buried-insulator laminate structure at least substantially closes the pores of the porous semiconductor layer so that the buried insulator layer is at least substantially non-porous.

11. The method of claim 1 further comprising:
    refining the buried-insulator laminate structure into an operational FINFET (fin-including field-effect transistor) device.

12. A method of forming structures to be used in a semiconductor device, the method, comprising:
    providing a first laminate structure including a set of base layer(s) including at least a top base layer, where the top base layer is made of silicon;
    refining the first laminate structure into a second laminate structure by epitaxially growing a highly-doped silicon layer on a top surface of the top base layer;
    refining the second laminate structure into a third laminate structure by epitaxially growing a fin-making layer on a top surface of the highly-doped silicon layer, with the fin-making layer being made of semiconductor material;
    refining the third laminate structure into a fourth laminate structure by performing a porousification process to form pores in the highly-doped silicon layer in order to change the highly-doped silicon layer into a porous silicon layer;
    refining the fourth laminate structure into a fifth laminate structure by selectively removing material from the fin-making layer to form a set of fin structures from the material of the fin-making layer;
    refining the fifth laminate structure into a sixth laminate structure by forming a set of gate structures with each gate structure of the set of gate structures extending over and across at least some of the fin structures;
    refining the sixth laminate structure into a seventh laminate structure by growing by strained epitaxy a component-making layer of semiconductor material in at least some areas bounded by a pair of fin structures and a pair of gate structures; and
    refining the seventh laminate structure into an eighth laminate structure by introducing oxygen gas into pores of the porous silicon layer at an elevated temperature to oxidize the silicon of the porous silicon layer and thereby changing the porous silicon layer into a buried oxide layer.

13. The method of claim 12 wherein:
the porousification process includes bathing the third laminate structure in a hydrogen fluoride (HF) bath.

14. The method of claim 13 wherein:
the porousification process further includes a hydrogen (H2) anneal to substantially close pores created in the fin-making layer and/or the set of base layer(s) by the HF bath.

15. The method of claim 12 wherein:
the top base layer is lightly doped with boron;
the highly-doped silicon layer is highly doped with boron; and
the fin-making layer is made of silicon lightly doped with boron.

16. The method of claim 15 wherein:
the top base layer is doped with boron at a concentration on the order of E18atoms per centimeter squared;
the highly-doped silicon layer is doped with boron at a concentration on the order of E20 atoms per centimeter squared; and
the fin-making layer is doped with boron at a concentration on the order of E18atoms per centimeter squared.

17. The method of claim 12 wherein:
in the refinement of the fourth structure into the fifth laminate structure, the selective removal of material from the fin-making layer leaves a component-base layer over the porous silicon layer in areas where fin structures are not present;
in the refinement of the sixth laminate structure into the seventh laminate structure, the component-making layer is epitaxially grown on segmented top surfaces of the component-base layer in segments bounded by pairs of fin structures and pairs of gate structures; and
in refinement of the seventh laminate structure into the eighth laminate structure, the oxygen gas further oxidizes the silicon of the component-base layer and thereby changes the component-base layer into an uppermost portion of the buried oxide layer.

18. The method of claim 12 further comprising:
refining the eighth laminate structure into an operational FINFET (fin-including field-effect transistor) device.

19. A method of forming structures for a semiconductor device, the method comprising:
providing a structure including a base layer, a porous semiconductor layer located on the base layer, and a fin-making layer located on the porous semiconductor layer;
selectively removing a portion of the fin-making layer to form a plurality of fins;
forming a plurality of gate structures over and across the plurality of fins;
epitaxially growing a strained semiconductor layer in an area bounded by a pair of the plurality of fins and a pair of the plurality of gate structures; and
introducing a reactive gas into pores of the porous semiconductor layer such that the reactive gas reacts with the porous semiconductor layer to yield an electrically insulative material.

* * * * *